United States Patent
Korolik et al.

(10) Patent No.: US 7,799,141 B2
(45) Date of Patent: *Sep. 21, 2010

(54) METHOD AND SYSTEM FOR USING A TWO-PHASES SUBSTRATE CLEANING COMPOUND

(75) Inventors: Mikhail Korolik, San Jose, CA (US); Erik M. Freer, Campbell, CA (US); John M. de Larios, Palo Alto, CA (US); Katrina Mikhaylichenko, San Jose, CA (US); Mike Ravkin, Sunnyvale, CA (US); Fritz Redeker, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 128 days.

This patent is subject to a terminal disclaimer.

(21) Appl. No.: 11/519,354

(22) Filed: Sep. 11, 2006

(65) Prior Publication Data
US 2007/0087950 A1     Apr. 19, 2007

Related U.S. Application Data

(63) Continuation-in-part of application No. 10/608,871, filed on Jun. 27, 2003, now abandoned.

(60) Provisional application No. 60/755,377, filed on Dec. 30, 2005.

(51) Int. Cl.
*B08B 7/00*     (2006.01)

(52) U.S. Cl. .............................. 134/6; 134/26; 134/33; 134/137; 134/149

(58) Field of Classification Search ....................... None
See application file for complete search history.

(56) References Cited

U.S. PATENT DOCUMENTS

| 3,037,887 A | 6/1962 | Brenner et al. ................. 134/22 |
| 3,212,762 A | 10/1965 | Carroll et al. ............... 261/124 |
| 3,436,262 A | 4/1969 | Crowe et al. .................. 134/10 |
| 3,617,095 A | 11/1971 | Lissant ....................... 406/197 |

(Continued)

FOREIGN PATENT DOCUMENTS

DE     40-38-587     6/1992

(Continued)

OTHER PUBLICATIONS

International Search Report (2 pages).

(Continued)

*Primary Examiner*—Michael Barr
*Assistant Examiner*—Eric Golightly
(74) *Attorney, Agent, or Firm*—Martine Penilla & Gencarella, LLP

(57) ABSTRACT

Cleaning compounds, apparatus, and methods to remove contaminants from a substrate surface are provided. An exemplary cleaning compound to remove particulate contaminants from a semiconductor substrate surface is provided. The cleaning compound includes a viscous liquid with a viscosity between about 1 cP to about 10,000 cP. The cleaning compound also includes a plurality of solid components dispersed in the viscous liquid, the plurality of solid components interact with the particulate contaminants on the substrate surface to remove the particulate contaminants from the substrate surface.

24 Claims, 7 Drawing Sheets

U.S. PATENT DOCUMENTS

| | | | |
|---|---|---|---|
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | 134/122 R |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | 134/7 |
| 5,242,669 A | 9/1993 | Flor | 423/465 |
| 5,271,774 A | 12/1993 | Leenaars et al. | 134/31 |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | 134/30 |
| 5,705,223 A | 1/1998 | Bunkofske | 427/240 |
| 5,800,626 A | 9/1998 | Cohen et al. | 134/1.3 |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | 431/39 |
| 5,944,582 A | 8/1999 | Talieh | 451/41 |
| 5,945,351 A | 8/1999 | Mathuni | 438/706 |
| 5,951,779 A | 9/1999 | Koyanagi et al. | 134/2 |
| 5,964,954 A | 10/1999 | Matsukawa et al. | 134/6 |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | 134/2 |
| 6,015,707 A * | 1/2000 | Emalfarb et al. | 435/263 |
| 6,048,409 A | 4/2000 | Kanno et al. | 134/34 |
| 6,049,996 A | 4/2000 | Freeman et al. | 34/362 |
| 6,081,650 A | 6/2000 | Lyons et al. | 386/95 |
| 6,090,217 A | 7/2000 | Kittle | 134/11 |
| 6,092,538 A | 7/2000 | Arai et al. | 134/1.3 |
| 6,152,805 A | 11/2000 | Takahashi | 451/36 |
| 6,158,445 A | 12/2000 | Olesen et al. | 134/1.3 |
| 6,167,583 B1 | 1/2001 | Miyashita et al. | 15/77 |
| 6,228,563 B1 | 5/2001 | Starove et al. | 430/327 |
| 6,231,628 B1 * | 5/2001 | Zavattari et al. | 51/293 |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | 15/77 |
| 6,276,459 B1 | 8/2001 | Herrick et al. | 169/14 |
| 6,286,231 B1 | 9/2001 | Bergman et al. | 34/410 |
| 6,288,154 B1 * | 9/2001 | Rhoades | 524/406 |
| 6,290,780 B1 | 9/2001 | Ravkin | 134/6 |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | 451/57 |
| 6,398,975 B1 | 6/2002 | Mertens et al. | 216/92 |
| 6,401,734 B1 | 6/2002 | Morita et al. | 134/153 |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | 15/77 |
| 6,491,043 B2 | 12/2002 | Mohindra et al. | 134/25.4 |
| 6,491,764 B2 | 12/2002 | Mertens et al. | 134/36 |
| 6,493,902 B2 | 12/2002 | Lin | 15/302 |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotikis | 134/6 |
| 6,530,968 B2 | 3/2003 | Tsuchiya et al. | |
| 6,532,976 B1 | 3/2003 | Huh et al. | 134/111 |
| 6,537,915 B2 | 3/2003 | Moore et al. | 438/692 |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | 15/102 |
| 6,616,772 B2 | 9/2003 | de Larios et al. | 134/21 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | 134/28 |
| 6,846,380 B2 | 1/2005 | Dickinson et al. | 156/354.31 |
| 6,851,435 B2 | 2/2005 | Mertens et al. | 134/99.1 |
| 6,874,516 B2 | 4/2005 | Matsuno et al. | 134/148 |
| 6,733,596 B1 | 5/2005 | Mikhaylichenko et al. | 134/6 |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | 216/689 |
| 2002/0072482 A1 | 6/2002 | Sachdev et al. | 510/175 |
| 2002/0094684 A1 | 7/2002 | Hirasaki et al. | 438/689 |
| 2002/0121290 A1 | 9/2002 | Tang et al. | 134/6 |
| 2002/0185164 A1 | 12/2002 | Tetsuka et al. | 134/148 |
| 2002/0195121 A1 | 12/2002 | Kittle | 134/3 |
| 2003/0075204 A1 | 4/2003 | de Larios et al. | 134/21 |
| 2003/0148903 A1 | 8/2003 | Bargaje et al. | 510/130 |
| 2003/0171239 A1 | 9/2003 | Patel et al. | 510/406 |
| 2003/0226577 A1 | 12/2003 | Orll et al. | 134/1.3 |
| 2004/0002430 A1 | 1/2004 | Verhaverbeke | 510/175 |
| 2004/0053808 A1 | 3/2004 | Raehse et al. | 510/447 |
| 2004/0134515 A1 | 7/2004 | Castrucci | 134/2 |
| 2004/0159335 A1 | 8/2004 | Montierth et al. | 134/10 |
| 2004/0163681 A1 | 8/2004 | Verhaverbeke | 134/28 |
| 2004/0261823 A1 | 12/2004 | de Larios | 134/31 |
| 2005/0045209 A1 | 3/2005 | Tan | 134/18 |
| 2005/0132515 A1 | 6/2005 | Boyd et al. | 15/77 |
| 2005/0133060 A1 | 6/2005 | de Larios et al. | 134/1.3 |
| 2005/0133061 A1 | 6/2005 | de Larios et al. | 134/6 |
| 2005/0159322 A1 | 7/2005 | Min et al. | 510/175 |
| 2005/0176606 A1 | 8/2005 | Konno et al. | 510/175 |
| 2005/0183740 A1 | 8/2005 | Fulton et al. | 134/3 |
| 2006/0128590 A1* | 6/2006 | Freer et al. | 510/417 |
| 2006/0201267 A1 | 9/2006 | Liu | 74/89.2 |
| 2006/0283486 A1 | 12/2006 | de Larios et al. | 134/34 |
| 2006/0285930 A1 | 12/2006 | de Larios et al. | 406/197 |
| 2007/0000518 A1 | 1/2007 | Korolik et al. | |
| 2007/0079848 A1* | 4/2007 | Freer et al. | 134/2 |
| 2007/0084485 A1* | 4/2007 | Freer et al. | 134/26 |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |

| | | |
|---|---|---|
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Aubert, JM et al.; "Aqueous foams"; Scientific America; 1986, 74-82, 254.

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam Wafer Cleaning and Drying the Future?" <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collloge, Dublin; 1999.

Kittle, et al.; "Photoreisist Removal Using Aqueous Foam"; Internet; http://www.aquafoam.com/paper/SCCPresentation.pdf.

Kittle, et al.; "Aqueous Foam Drying and Cleaning of Semiconductor Wafers"; Internet; http://www.aquafoam.com/paper/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al. "Removing Particles with a Foam Medium" Internet http://www.aquafoam.com/paper/A2C2foamedium.pdf.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.
U.S. Appl. No. 11/743,283, filed May 2, 2007, Freer et al.

* cited by examiner

METHOD AND SYSTEM FOR USING A TWO-PHASES SUBSTRATE CLEANING COMPOUND

CROSS REFERENCE TO RELATED APPLICATION

This application claims the benefit of U.S. Provisional Application Ser. No. 60/755,377, filed Dec. 30, 2005. Additionally, this application is a continuation-in-part of prior Application Ser. No. 10/608,871, filed Jun. 27, 2003, now abandoned and entitled "Method and Apparatus for Removing a Target Layer From a Substrate Using Reactive Gases." The disclosure of each of the above-identified applications is incorporated herein by reference for all purposes. This application is related to U.S. patent application Ser. No. 10/816,337, filed on Mar. 31, 2004, and entitled "Apparatuses and Methods for Cleaning a Substrate," and U.S. patent application Ser. No. 11/173,132, filed on Jun. 30, 2005, and entitled "System and Method for Producing Bubble Free Liquids for Nanometer Scale Semiconductor Processing," and U.S. patent application Ser. No. 11/153,957, filed on Jun. 15, 2005, and entitled "Method and Apparatus for Cleaning a Substrate Using Non-Newtonian Fluids," and U.S. patent application Ser. No. 11/154,129, filed on Jun. 15, 2005, and entitled "Method and Apparatus for Transporting a Substrate Using Non-Newtonian Fluid," and U.S. patent application Ser. No. 11/174,080, filed on Jun. 30, 2005, and entitled "Method for Removing Material from Semiconductor Wafer and Apparatus for Performing the Same," and U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," and U.S. patent application Ser. No. 11/336,215 filed on Jan. 20, 2006, and entitled "Method and Apparatus for Removing Contamination from Substrate." The disclosure of each of these related applications is incorporated herein by reference for all purposes.

BACKGROUND

In the fabrication of semiconductor devices such as integrated circuits, memory cells, and the like, a series of manufacturing operations are performed to define features on semiconductor substrates ("substrates"). During the series of manufacturing operations, the substrate surface is exposed to various types of contaminants. Essentially any material present in a manufacturing operation is a potential source of contamination. For example, sources of contamination may include process gases, chemicals, deposition materials, etch by-products, and liquids, among others. The various contaminants may deposit on the wafer surface in particulate form (particles).

The surface of semiconductor substrates must be cleaned of substrate contaminants. If not removed, the devices within the vicinity of the contamination will likely be inoperable. Substrate contaminants may also affect device performance characteristics and cause device failure to occur at faster rates than usual. Thus, it is necessary to clean contaminants from the substrate surface in a substantially complete manner without damaging the substrate surface and the features defined on the substrate. The size of particulate contamination is often on the order of the critical dimension size of features fabricated on the wafer. Removal of such small particulate contamination without adversely affecting the surface and features on the substrate can be quite difficult.

In view of the foregoing, there is a need for an improved substrate cleaning technique to remove contaminants from substrate surface to improve device yield.

SUMMARY

Broadly speaking, the embodiments fill the need by providing improved substrate cleaning techniques to remove contaminants from the substrate surface to improve device yield. It should be appreciated that the present invention can be implemented in numerous ways, including as a solution, a method, a process, an apparatus, or a system. Several inventive embodiments of the present invention are described below.

In one embodiment, a cleaning compound to remove particulate contaminants from a semiconductor substrate surface is provided. The cleaning compound includes a viscous liquid with a viscosity between about 1 cP to about 10,000 cP. The cleaning compound also includes a plurality of solid components dispersed in the viscous liquid, the plurality of solid components interact with the particulate contaminants on the substrate surface to remove the particulate contaminants from the substrate surface.

In another embodiment, an apparatus for cleaning particulate contaminants from a substrate surface of a substrate is provided. The apparatus includes a substrate support assembly for holding the substrate. The apparatus also includes an applicator to dispense a cleaning compound to clean the particulate contaminants from the substrate surface, wherein the cleaning compound is a viscous liquid having a viscosity between about 1 cP to about 10,000 cP at the shear rate of 1 per second and a plurality of solid components are dispersed in the viscous liquid.

In yet another embodiment, a method to clean particulate contaminants from a substrate surface is provided. The method includes applying a viscous liquid having solid components dispersed therein to the substrate surface. The method also includes applying a force having a down-ward component and a shear component to the viscous liquid to bring at least one solid component within proximity of a particulate contaminant on the substrate surface. The method further includes removing the at least one solid component and the particulate contaminant away from the substrate surface.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for improved substrate cleaning technique to remove particulate contaminants from the substrate to improve process yield are provided. It should be appreciated that the present invention can be implemented in numerous ways, including as a solution, a process, a method, an apparatus, or a system. Several inventive embodiments of the present invention are described below. It will be apparent to those skilled in the art that the present invention may be practiced without some or all of the specific details set forth herein.

The embodiments described herein provide for a cleaning technique that eliminates the need for abrasive contact and is efficient at cleaning contaminants from semiconductor substrates, some of which may contain high aspect ratio features. While the embodiments provide specific examples related to semiconductor cleaning applications, these cleaning applications may be extended to any technology requiring the removal of contaminants from a substrate. As described below, a cleaning solution having a continuous liquid phase and a dispersed solid phase is provided. Solid particles are dispersed throughout the liquid phase.

Figure 1A:
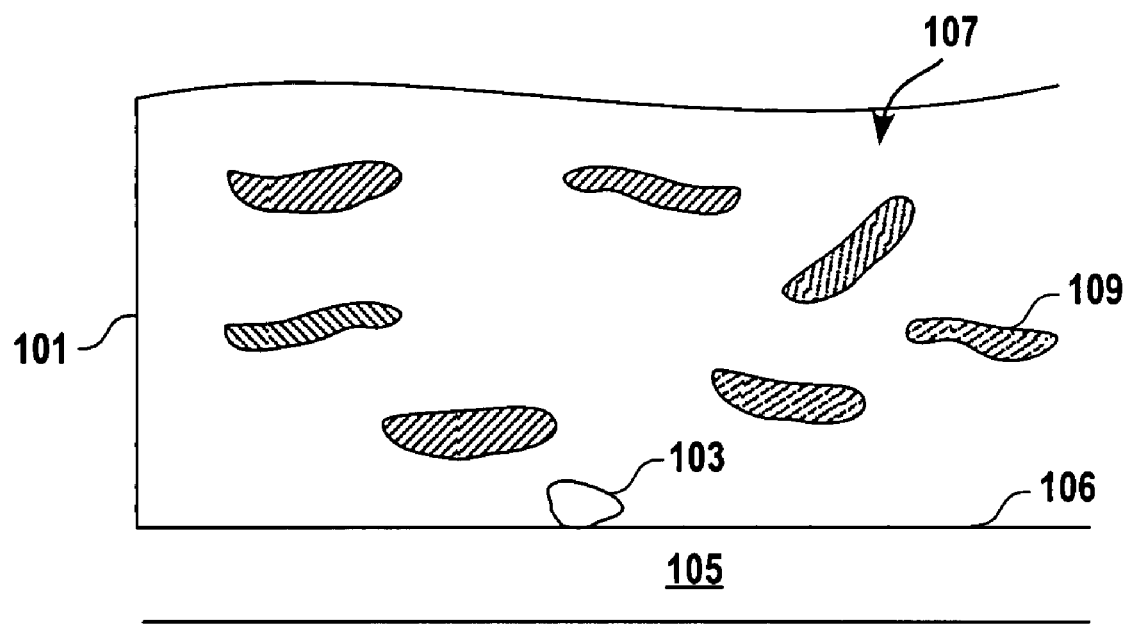
FIG. 1A shows a physical diagram of a cleaning solution for removing particulate contamination from a substrate surface, in accordance with one embodiment of the present invention.

FIG. 1A shows a physical diagram of a cleaning solution (or compound) 101 for removing contaminants 103 from a surface 106 of a semiconductor substrate 105, in accordance with one embodiment of the present invention. The cleaning solution 101 includes a viscous liquid 107, and solid components 109. The solid components 109 are dispersed within the viscous liquid 107. The viscous liquid 107 provides a vehicle to bring the solid components 109 proximate to the contaminants 103 in order for the solid components 109 and the contaminants 103 to interact to eventually remove the contaminants 103 from the substrate surface 106. In one embodiment, the solid components 109 are hydrolyzed by a chemical agent, or by added surfactant. In one embodiment, the cleaning solution 101 can be prepared by dissolving a carboxylic acid solid in de-ionized water (DIW) with a weight/weight percent greater than 2%. The solid compounds 109 are carboxylic acid solids precipitated from dissolved carboxylic acid in the DIW. In one embodiment, the carbon number of the carboxylic acid is $\geq 4$. The dissolved carboxylic acid would form a viscous liquid 107 with a viscosity between 1 cP (centi-Poise) to about 10,000 cP at the shear rate of 1 per second. One thing to note is that the cleaning compound (or solution) can be made by mixing carboxylic acid(s) (or salts) in solvents other than water. Other polar or non-polar solvents, such as alcohol, can also be used.

Figure 1B:
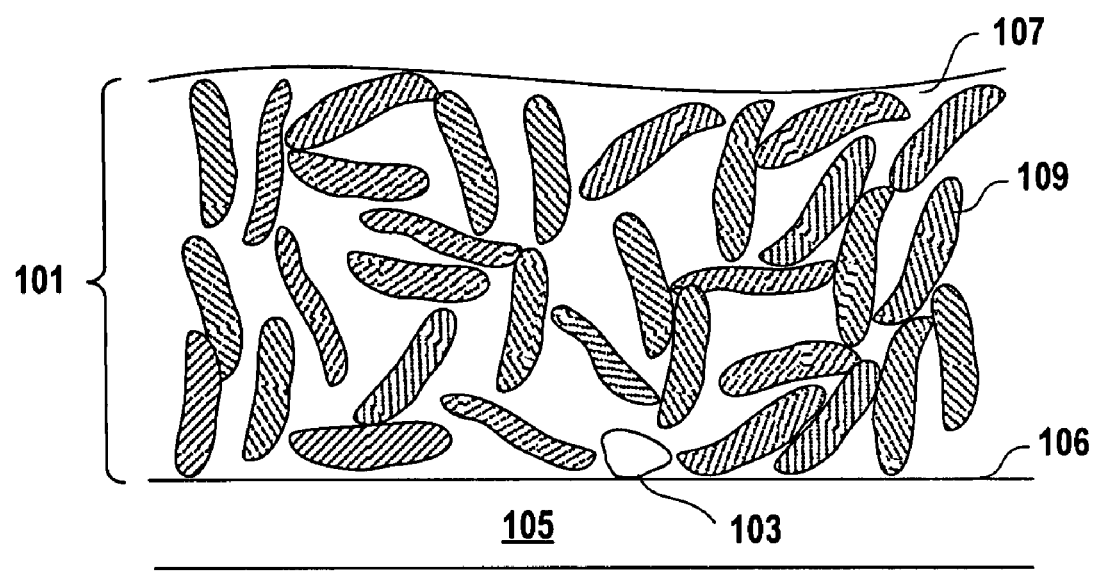
FIG. 1B shows a physical diagram of a cleaning solution with a gel and a network of solid compounds.

The solid components 109 are dispersed in suspension within the viscous liquid 107. In one embodiment, the viscous liquid 107 is a gel that combines with a network of solid components 109 to form the cleaning compound 101, which can be applied on the substrate surface 106, as shown in FIG. 1B. The solid components 109 interact with one another to form the network of solid compound through van der Waals forces. The solid components 109 are suspended within the viscous liquid 107, which is in the form of a gel. The relatively high viscosity of the gel allows a force applied on the gel to transmit the force on the solid compound in the gel. The cleaning compound 101, as shown in FIG. 1B, can be formed by mixing higher concentration of the carboxylic acid solids, such as between about 3% to about 5% and preferably between about 4% to about 5%, with DIW. In one embodiment, the mixture of carboxylic acid solids and DIW can be heated to about 75° C. to about 85° C. to shorten the duration for the solids to be dissolved in DIW. Once the solids are dissolved, the cleaning solution can be cooled down. During the cooling down process, solid compounds in the form of needles or plates would precipitates.

Figure 1C:
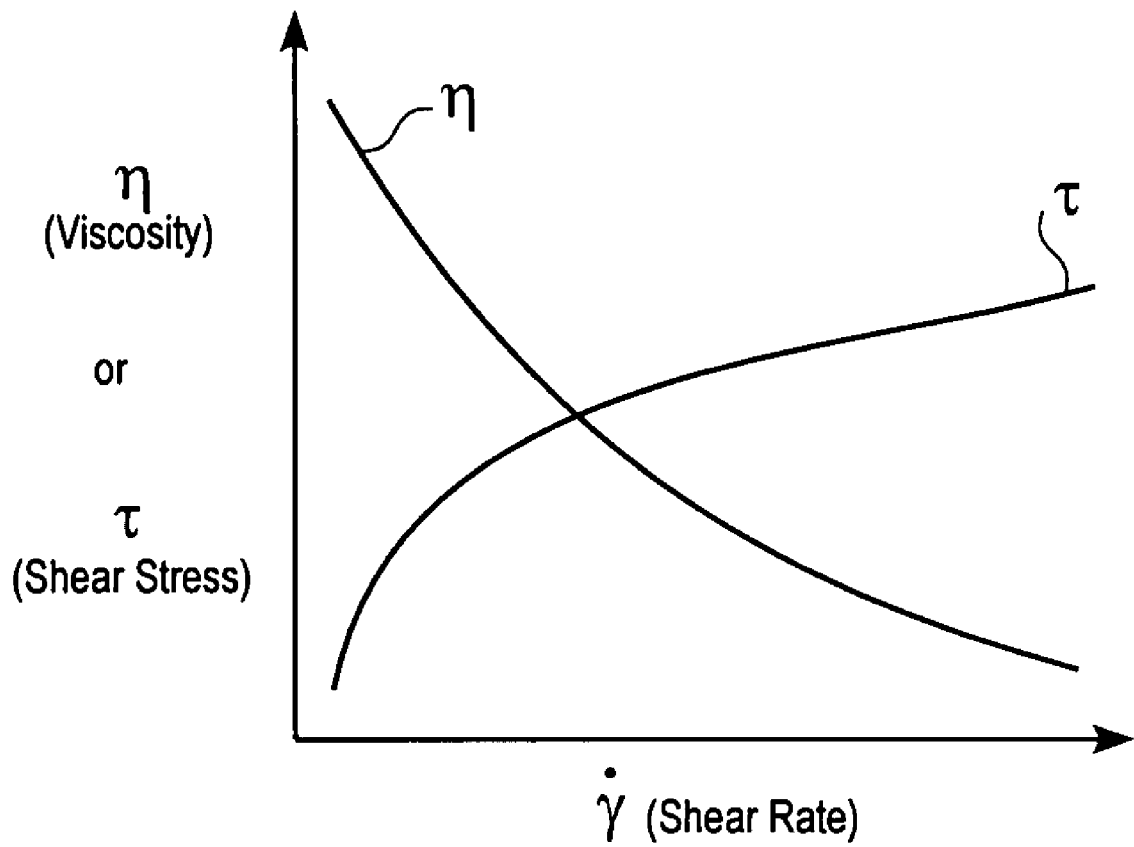
FIG. 1C shows a diagram of stress and viscosity as a function of shear rate for a non-Newtonian fluid.

In one embodiment, the viscous liquid 107 is a non-Newtonian fluid whose viscosity decreases with the increase of shear rate. However, the viscous fluid 107 can be a Newtonian fluid. FIG. 1C shows a diagram of a non-Newtonian fluid of the described embodiment. The viscosity approaches zero when the shear rate is very high. The viscosity of the non-Newtonian fluid decreases as the shear rate increases. During the cleaning operation, a certain range of shear rate is selected. As an example, a liquid gel with 3-4 weight/weight % carboxylic acid in DIW has a viscosity of about 1000 cP at 0.1 per second shear rate and the viscosity falls to about 10 cP when the shear rate increases to 1000 per second.

As described above, the viscous liquid 107 has a viscosity between about 10 cP to about 10,000 cp. When a shear force is applied on a surface of the solution 101, the viscous liquid 107 can transfer part of the shear force to the solid compounds 109. The solid compounds 109 would contact contaminants 103 and move the contaminants away from the substrate surface.

It should be understood that depending on the particular embodiment, the solid components 109 within the cleaning material 101 may possess physical properties representing essentially any sub-state within the solid phase, wherein the solid phase is defined as a phase other than liquid or gas. For example, physical properties such as elasticity and plasticity can vary among different types of solid components 109 within the cleaning material 101. Additionally, it should be understood that in various embodiments the solid components 109 can be defined as crystalline solids or non-crystalline solids. Regardless of their particular physical properties, the solid components 109 within the cleaning material 101 should be capable of avoiding adherence to the surface of substrate surface 106 when positioned in either close proximity to or in contact with the substrate surface 106. Additionally, the mechanical properties of the solid components 109 should not cause damage to the substrate surface 106 during the cleaning process. In one embodiment, the hardness of the solid components 109 is less than the hardness of the substrate surface 106.

Figure 1D:
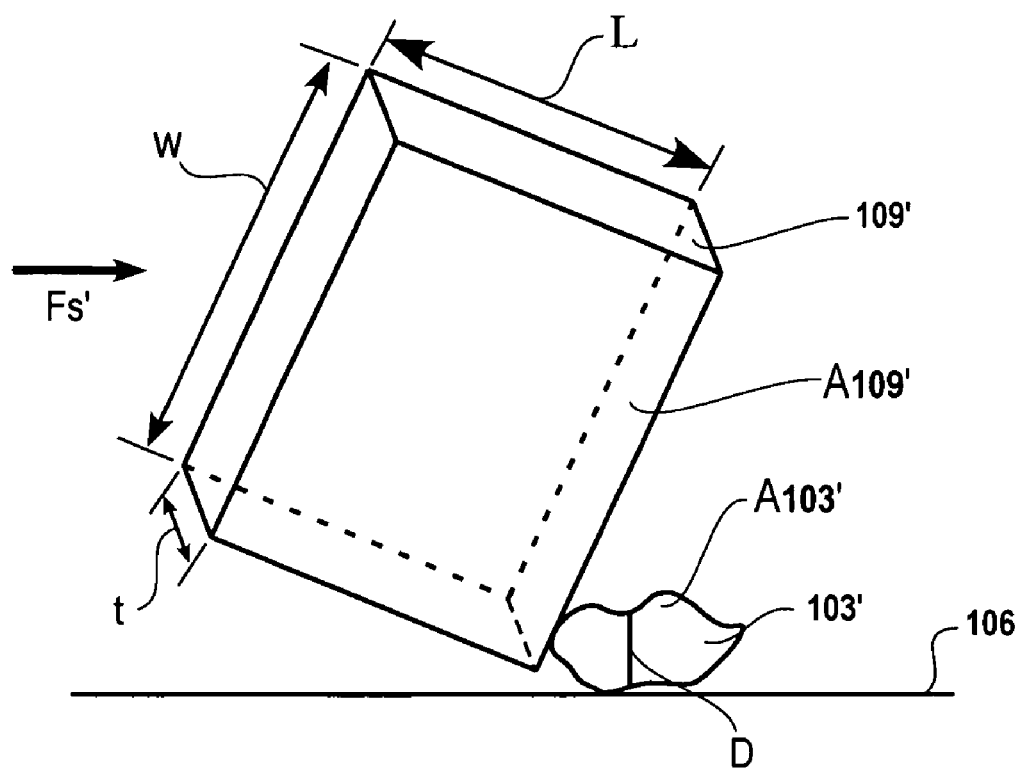
FIG. 1D shows a physical diagram of a solid component of the cleaning solution of FIG. 1A in the proximity of a contaminant on the substrate surface.

Furthermore, the solid components 109 should be capable of establishing an interaction with the contaminants 103 present on the substrate surface 106 when positioned in either close proximity or contact with the contaminants 103. For example, the size and shape of the solid components 109 should be favorable for establishing the interaction between the solid components 109 and the contaminants 103. In one embodiment, the solid compounds 109 have cross-sectional areas greater than the cross-sectional areas of the contaminants. As shown in FIG. 1D, when a solid compound 109' with a large surface area $A_{109}$ compared to the surface area $A_{103'}$ of a particulate contaminant 103', the shear force $F_s'$ exerted on the solid compound 109' is transmitted upon the particulate contaminant 103' at a shear force multiplied roughly by the area ratio ($F_s' \times A_{109'}/A_{103'}$). For example, the effective diameter D of the particulate contaminant 103' is less than about 0.1 micron. The width W and length L of the solid compound 109' are both between about 5 micron to about 50 micron and the thickness of the solid compound 109' is between about 1 micron to about 5 micron. The area ratio (or force multiplier) could be between 2,500 to about 250,000 or greater. The shear force exerted on the particulate contaminant 103' could be very large and could dislodge particulate contaminant 103' from the substrate surface 106.

Energy transferred from the solid component 109' to the contaminant 103' can occur through direct or indirect contact and may cause the contaminant 103' to be dislodged from the substrate surface 106. In this embodiment, the solid component 109' may be softer or harder than the contaminant 103'. If the solid component 109' is softer than the contaminant 103', greater deformation of the solid component 109' is likely to occur during the collision, resulting in less transfer of kinetic energy for dislodging the contaminant 103' from the substrate surface 106. In the case where the solid component 109' is softer than the contaminant 103', the adhesive connection between the solid component 109' and the contaminant 103' may be stronger. Conversely, if the solid component 109' is at least as hard as the contaminant 103', a substantially complete transfer of energy can occur between the solid component 109' and the contaminant 103', thus increasing the force that serves to dislodge the contaminant 103' from the substrate surface 106. However, in the case where the solid component 109' is at least as hard as the contaminant 103', interaction forces that rely on deformation of the solid component 109' may be reduced. It should be appreciated that physical properties and relative velocities associated with the solid component 109' and the contaminant 103' will influence the collision interaction there between.

Figure 1E:
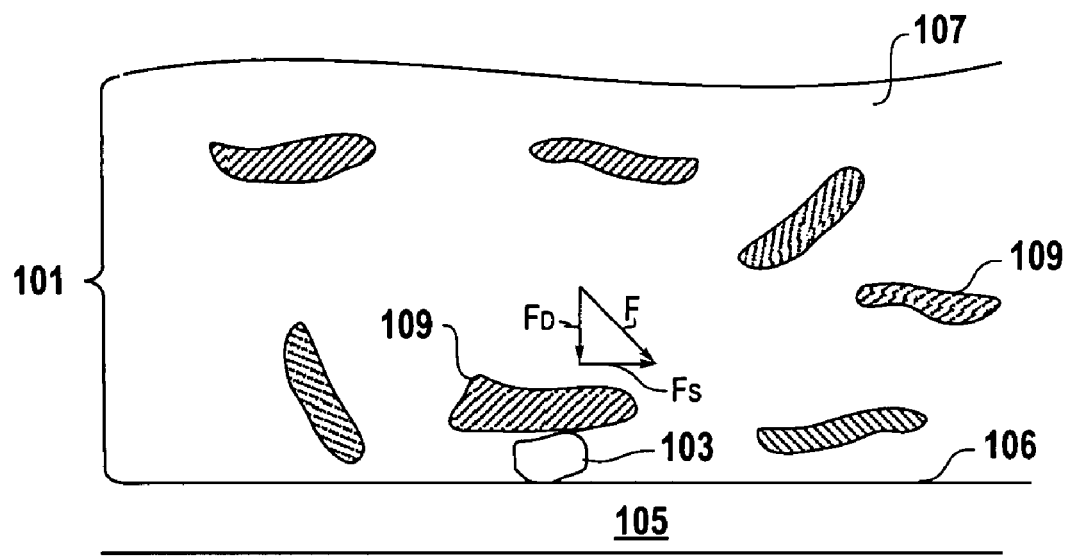
FIG. 1E shows a physical diagram of solid component of the cleaning solution of FIG. 1A making contact with contaminant on the substrate surface.
Figure 1F:
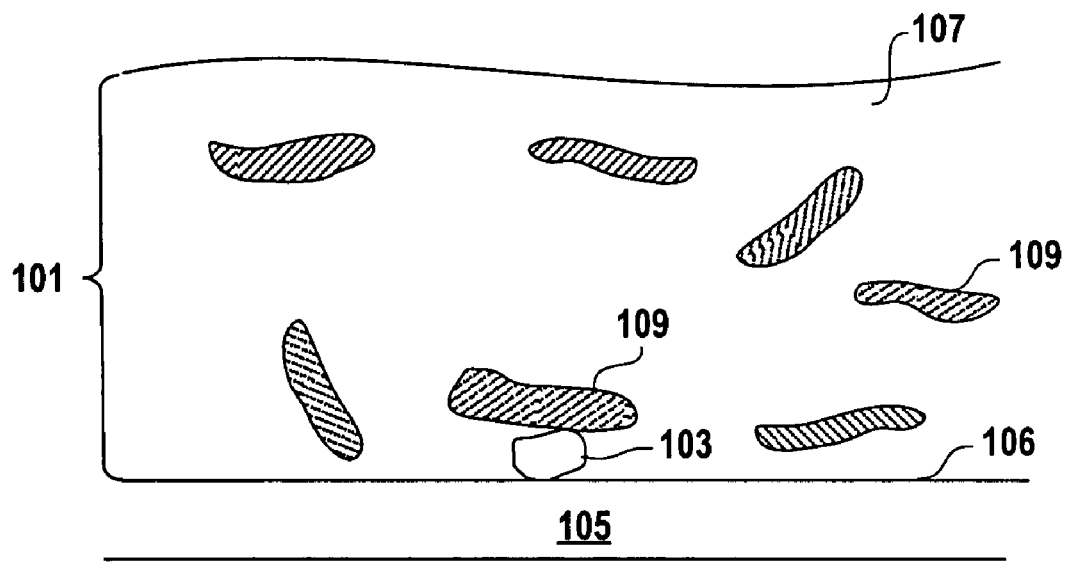
FIG. 1F shows a physical diagram of solid component of the cleaning solution of FIG. 1A moving contaminant away from the substrate surface.

FIGS. 1E and 1F show another embodiment of how the cleaning material 101 functions to remove the contaminant 103 from the substrate surface 106. During the cleaning process a downward force $F_D$, which is a downward component of force F, is exerted on the solid components 109 within the viscous liquid 107 such that the solid components 109 are brought within close proximity or contact with the contaminants 103 on the substrate surface 106. The relatively high viscosity of the viscous liquid 107 enables a significant portion of the downward force applied on the viscous liquid 107 to be exerted on the solid components 109. When the solid component 109 is forced within sufficient proximity to or contact with the contaminant 103, an interaction is established between the solid component 109 and the contaminant 103. The interaction between the solid component 109 and the contaminant 103 is sufficient to overcome an adhesive force between the contaminant 103 and the substrate surface 106, as well as any repulsive forces between the solid component 109 and the contaminant. Therefore, when the solid component 109 is moved away from the substrate surface 106 by a sheer force $F_s$, which is a shear component for force F, the contaminant 103 that interacted with the solid component 109 is also moved away from the substrate surface 106, i.e., the contaminant 103 is cleaned from the substrate surface 106. In one embodiment, the interaction between the solid component 109 and contaminant 103 occurs when the solid component 109 is forced sufficiently close to the contaminant 103. In one embodiment, this distance may be within about 10 nanometers. In another embodiment, the interaction between the solid component 109 and contaminant 103 occurs when the solid component 109 actually contacts the contaminant 103. This interaction may also be referred to as solid component 109 engaging contaminant 103.

The interaction force between the solid component 109 and the contaminant 103 is stronger than the force connecting the contaminant 103 to the substrate surface 106. FIG. 1F, shows when a solid component 109 is moved away from the substrate surface 106, the contaminant 103 bound to the solid component 109 is also moved away from the substrate surface 106. It should be noted that multiple contaminant removal mechanisms can occur during the cleaning process.

It should be appreciated that because the solid components 109 interact with the contamination 103 to affect the cleaning process, contamination 103 removal across the substrate surface 106 will be dependent on how well the solid components 109 are distributed across the substrate surface 106. In a preferred embodiment, the solid components 109 will be so well distributed that essentially every contaminant 103 on the substrate surface 106 will be in proximity to at least one solid component 109. It should also be appreciated that one solid component 109 may come in contact with or interact with more than one contaminant 103, either in a simultaneous manner or in a sequential manner. Furthermore, solid component 109 may be a mixture of different components as opposed to all the same component. Thus, the cleaning solution is capable of being designed for a specific purpose, i.e., targeting a specific contaminant, or the cleaning solution can have a broad spectrum of contaminant targets where multiple solid components are provided.

Interaction between the solid component 109 and the contaminant 103 can be established through one or more mechanisms including adhesion, collision, and attractive forces, among others. Adhesion between the solid component 109 and contaminant 103 can be established through chemical interaction and/or physical interaction. For example, in one embodiment, chemical interaction causes a glue-like effect to occur between the solid component 109 and the contaminant 103. In another embodiment, physical interaction between the solid component 109 and the contaminant 103 is facilitated by the mechanical properties of the solid component 109. For example, the solid component 109 can be malleable such that when pressed against the contaminant 103, the contaminant 103 becomes imprinted within the malleable solid component 109. In another embodiment, the contaminant 103 can become entangled in a network of solid components 109. In this embodiment, mechanical stresses can be transferred through the network of solid components 109 to the contaminant 103, thus providing the mechanical force necessary for removal of the contaminant 103 from the substrate surface 106.

Deformation of the solid component 109 due to imprinting by the contaminant 103 creates a mechanical linkage between the solid component 109 and the contaminant 103. For example, a surface topography of the contaminant 103 may be such that as the contaminant 103 is pressed into the solid component 109, portions of the solid component 109 material enters regions within the surface topography of the contaminant 103 from which the solid component 109 material cannot easily escape, thereby creating a locking mechanism.

In addition to the foregoing, in one embodiment, interaction between the solid component 109 and contaminant 103 can result from electrostatic attraction. For example, if the solid component 109 and the contaminant 103 have opposite surface charges they will be electrically attracted to each other. It is possible that the electrostatic attraction between the solid component 109 and the contaminant 103 can be sufficient to overcome the force connecting the contaminant 103 to the substrate surface 106.

In another embodiment, an electrostatic repulsion may exist between the solid component 109 and the contaminant 103. For example, both the solid component 109 and the contaminant 103 can have either a negative surface charge or a positive surface charge. If the solid component 109 and the contaminant 103 can be brought into close enough proximity, the electrostatic repulsion there between can be overcome through van der Waals attraction. The force applied by the viscous liquid 107 to the solid component 109 may be sufficient to overcome the electrostatic repulsion such that van der Waals attractive forces are established between the solid component 109 and the contaminant 103.

Additionally, in another embodiment, the pH of the viscous liquid 107 can be adjusted to compensate for surface charges present on one or both of the solid component 109 and contaminant 103, such that the electrostatic repulsion there between is reduced to facilitate interaction, or so that either the solid component or the contamination exhibit surface charge reversal relative to the other resulting in electrostatic attraction. For example, a base, such as Ammonium Hydroxide ($NH_4OH$), can be added to a carboxylic acid gel, made by dissolving 3-4% of a carboxylic acid in DIW, with fatty acid solid components to increase the pH value of the gel (viscous liquid). The amount of $NH_4OH$ added is between about 0.05% to about 5%, preferably between about 0.25% to about 2%. Ammonium Hydroxide helps the fatty acid solids to be hydrolyzed and to be dispersed in the gel. Ammonium Hydroxide can also hydrolyze the contaminants 103. To clean metal contaminants, lower pH solution can also be used. Buffered HF solution can be used to tune the pH value to be between about 6 to about 8.

In addition to using a base, such as Ammonium Hydroxide, to enhance cleaning efficiency, a surfactant, such as ammonium dodecyl sulfate, $CH_3(CH_2)_{11}OSO_3NH_4$, can also be added to the carboxylic acid gel. In one embodiment, about 0.1% to about 5% of surfactant is added to the cleaning solution 101. In a preferred embodiment, about 0.5% to about 2% surfactant is added to the cleaning solution 101.

In addition, the solid components 109 should avoid dissolution or having limited solubility in the viscous liquid 107, and should have a surface functionality that enables dispersion throughout the viscous liquid 107. For solid components 109 that do not have surface functionality that enables dispersion throughout the viscous liquid 107, chemical dispersants may be added to the viscous liquid 107 to enable dispersion of the solid components 109. Depending on their specific chemical characteristics and their interaction with the surrounding viscous liquid 107, solid components 109 may take one or more of several different forms. For example, in various embodiments the solid components 109 may form aggregates, colloids, gels, coalesced spheres, or essentially any other type of agglutination, coagulation, flocculation, agglomeration, or coalescence. In other embodiments, the solid components 109 may take a form not specifically identified herein. Therefore, the point to understand is that the solid components 109 can be defined as essentially any solid material capable of functioning in the manner previously described with respect to their interaction with the substrate surface 106 and the contaminants 103.

Some exemplary solid components 109 include aliphatic acids, carboxylic acids, paraffin, cellulose, wax, polymers, polystyrene, polypeptides, and other visco-elastic materials. The solid component 109 material should be present at a concentration that exceeds its solubility limit within the viscous liquid 107. In addition, it should be understood that the cleaning effectiveness associated with a particular solid component 109 material may vary as a function of temperature, pH, and other environmental conditions.

The aliphatic acids represent essentially any acid defined by organic compounds in which carbon atoms form open chains. A fatty acid is an example of an aliphatic acid and an example of a carboxylic acid that can be used as the solid components 109 within the cleaning material 101. Examples of fatty acids that may be used as the solid components 109 include lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid, lignoceric acid, cerotic acid, and mixtures thereof, among others. In one embodiment, the solid components 109 can represent a mixture of fatty acids defined by various carbon chain lengths extending from C4 to about C-26. Carboxylic acids are defined by essentially any organic acid that includes one or more carboxyl groups (COOH). Also, the carboxylic acids can include other functional groups such as but not limited to methyl, vinyl, alkyne, amide, primary amine, secondary amine, tertiary amine, azo, nitrile, nitro, nitroso, pyrifyl, carboxyl, peroxy, aldehyde, ketone, primary imine, secondary imine, ether, ester, halogen isocyanate, isothiocyanate, phenyl, benzyl, phosphodiester, sulfhydryl, but still maintaining insolubility long-chain alcohols, ethers, and/or ketones, above the solubility limit in the viscous liquid 107.

Additionally, the surface functionality of the solid component 109 materials can be influenced by the inclusion of moieties that are miscible with the viscous liquid 107, such as carboxylate, phosphate, sulfate groups, polyol groups, ethylene oxide, etc. The point to be understood is that the solid components 109 should be dispersible in a substantially uniform manner throughout the viscous liquid 107 such that the solid components 109 avoid clumping together into a form that cannot be forced to interact with the contaminants 103 present on the substrate 105.

It should be understood that the viscous liquid 107 can be modified to include ionic or non-ionic solvents and other chemical additives. For example, the chemical additives to the viscous liquid 107 can include any combination of co-solvents, pH modifiers, chelating agents, polar solvents, surfactants, ammonium hydroxide, hydrogen peroxide, hydrofluoric acid, tetramethylammonium hydroxide, and rheology modifiers such as polymers, particulates, and polypeptides.

Figure 2:
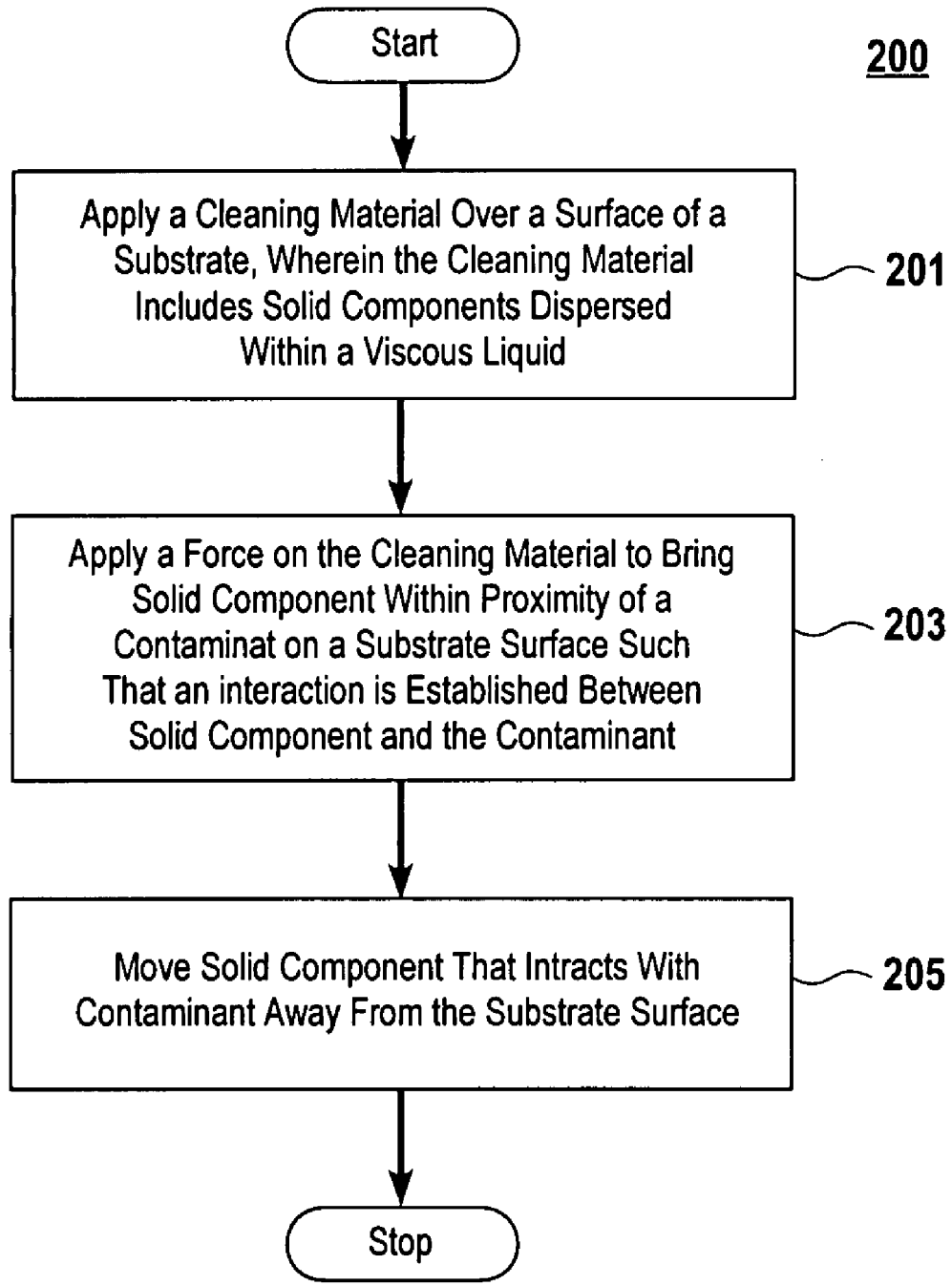
FIG. 2 shows an embodiment of a process flow for removing particulate contaminants from the surface of a substrate.

FIG. 2 is an illustration showing a flowchart of a method for removing contaminants from a substrate surface, in accordance with one embodiment of the present invention. It should be understood that the substrate referenced in the method of FIG. 2 can represent a semiconductor wafer or any other type of substrate from which contaminants associated with a fabrication process need to be removed. Also, the contaminants referenced in the method of FIG. 2 can represent essentially any type of surface contaminant associated with the semiconductor wafer fabrication process, including but not limited to particulate contamination, trace metal contamination, organic contamination, photoresist debris, contamination from wafer handling equipment, and wafer backside particulate contamination.

The method of FIG. 2 includes an operation 201 for disposing a cleaning material (or solution) over a substrate, wherein the cleaning material includes solid components dispersed within a viscous liquid, or a gel. The cleaning material referenced in the method of FIG. 2 is the same as previously described with respect to FIGS. 1A-1F. Therefore, the solid components within the cleaning material are dispersed in suspension within the viscous liquid. Also, the solid components are defined to avoid damaging the substrate and to avoid adherence to the substrate surface.

The method also includes an operation 203 for applying a force to a solid component to bring the solid component within proximity to a contaminant present on the substrate, such that an interaction is established between the solid component and the contaminant.

Additionally, in one embodiment, the method can include an operation for controlling a temperature of the cleaning material to enhance interaction between the solid component and the contaminant. More specifically, the temperature of the cleaning material can be controlled to control the properties of the solid component. For example, at a higher temperature the solid component may be more malleable such that it conforms better when pressed against the contaminant. Then, once the solid component is pressed and conformed to the contaminant, the temperature is lowered to make the solid component less malleable to better hold its conformal shape relative to the contaminant, thus effectively locking the solid component and contaminant together. The temperature may be used to control the viscosity of the viscous liquid. The temperature may also be used to control the solubility and therefore the concentration of the solid components. For example, at higher temperatures the solid component may be more likely to dissolve in the viscous liquid. The temperature may also be used to control and/or enable formation of solid components in-situ on the substrate from liquid-liquid suspension. In a separate embodiment, the method can include an operation for precipitating solids dissolved within the viscous liquid. This precipitation operation can be accomplished by dissolving the solids into a solvent and then adding a component that is miscible with the solvent but that does not dissolve the solid.

The method further includes an operation 205 for moving the solid component away from the substrate surface such that the contaminant that interacted with the solid component is removed from the substrate surface. In one embodiment, the method includes an operation for controlling a flow rate of the cleaning material over the substrate to control or enhance movement of the solid component and/or contaminant away from the substrate. The method of the present invention for removing contamination from a substrate can be implemented in many different ways so long as there is a means for applying a force to the solid components of the cleaning material such that the solid components establish an interaction with the contaminants to be removed.

In one embodiment, the method can include an operation of a final clean. In the operation of final clean, the substrate, that contains dislodged contaminants, is cleaned with a suitable chemical(s) that facilitates the removal of all the cleaning material from the substrate surface. For example, if the viscous liquid of the cleaning material is a carboxylic acid gel, $NH_4OH$ diluted in DIW could be used to remove carboxylic acid off the substrate surface. $NH_4OH$ hydrolyzes (or ionizes by deprotonating) the carboxylic acid and enables the hydrolyzed carboxylic acid to be lifted off the substrate surface. Alternatively, a surfactant, such as ammonium dodecyl Sulfate, $CH_3(CH_2)_{11}OSO_3NH_4$, can be added in DIW, to remove carboxylic acid gel off the substrate surface.

In another embodiment, a rinse operation follows the final clean operation described above. After the final clean, the substrate surface can be rinsed with a liquid, such as DIW, to remove the chemical(s) used in the final clean from the substrate surface. The liquid used in final rinse should leave no chemical residue(s) on the substrate surface after it evaporates.

Figure 3:
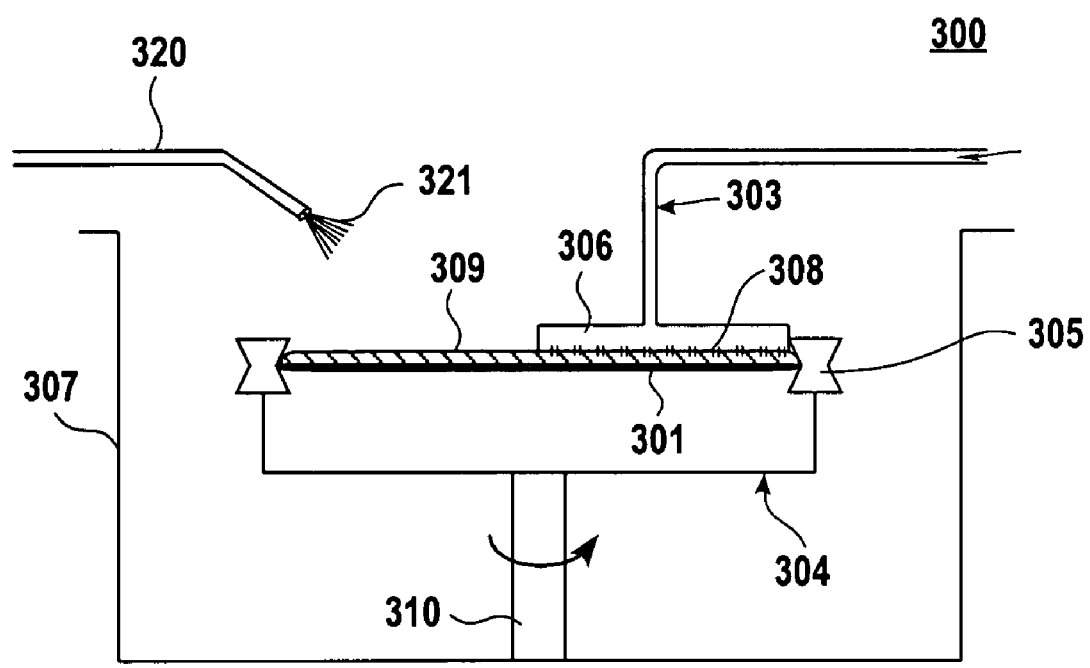
FIG. 3 shows a schematic diagram of an embodiment of a substrate surface cleaning system.

FIG. 3 shows a schematic diagram of an embodiment of a substrate surface cleaning system 300. System 300 has a container 307 that houses a substrate support assembly 304. The substrate support assembly 304 has a substrate holder 305 that supports a substrate 301. The substrate support assembly 304 is rotated by a rotating mechanism 310. System 300 has a cleaning material dispensing assembly 303 that include a cleaning material applicator 306. In the applicator 306, there are multiple dispensing holes 308 that allow the cleaning material to be dispensed on the surface of substrate 301. With the aid of the rotating mechanism 310, the cleaning material 309 covers the entire substrate surface. In one embodiment, the applicator 306, through the action of dispensing of the cleaning material, provides a down-ward force to cleaning material and to the substrate surface. The cleaning material can be pressed out of the applicator 306 by air pressure or by a mechanical pump. In another embodiment, the applicator 306 provides a down-ward force on the cleaning material on the substrate surface by a down-ward mechanical force. The rotating mechanism 310 provides a sheer force to the cleaning material and to the substrate surface. In one embodiment, the rotating mechanism 310 is rotated at a speed between about 1 round per minute (RPM) to about 100 RPM, preferably between about 5 RPM to about 30 RPM. The pressure exerted on the cleaning material (or compound) to push the cleaning material out of the applicator 306 is between about 5 PSI to about 20 PSI. Alternatively, the applicator 306 can rotates around the center of the substrate 301 to provide the shear force.

In one embodiment, system 300 also includes a dispenser 320, which can dispense DIW 321 on the substrate surface to clean the substrate surface of the cleaning material after the process of contaminant-removal by the cleaning material is completed. In another embodiment, the dispenser 320 can dispense a cleaning solution, such as $NH_4OH$ in DIW described above, on the substrate surface to hydrolyze the viscous liquid to enable the viscous liquid to be lifted off the substrate surface. Afterwards, the same dispenser 320 or a different dispenser (not shown) can dispense DIW to remove the cleaning solution from the substrate surface.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method for removing particulate contaminants from a semiconductor substrate, comprising:

dispensing a cleaning compound having a viscous liquid with solid components dispersed therein on a surface of a substrate upon which particulate contaminants are present, wherein the solid components are carboxylic acids having a carbon number greater than or equal to four;

applying a mechanical force having a downward component to the cleaning compound to bring at least one of the solid components within proximity of a particulate contaminant present on the surface of the substrate, wherein applying the mechanical force to the cleaning compound is performed separately from dispensing the cleaning compound on the surface of the substrate, wherein an interaction is established between the at least one of the solid components and the particulate contaminant, and wherein the interaction is sufficient to overcome an adhesive force between the particulate contaminant and the surface of the substrate such that the particulate component is dislodged from the surface of the substrate; and removing the at least one of the solid components and the particulate contaminant away from the surface of the substrate, wherein the method is performed without causing damage to physical features present on the surface of the substrate.

2. The method of claim 1, wherein a viscosity of the viscous liquid is between about 1 cP to about 10,000 cP.

3. The method of claim 1, wherein the viscous liquid is a non-Newtonian liquid whose viscosity decreases with shear stress.

4. The method of claim 1, wherein the viscous liquid is a gel.

5. The method of claim 1, further comprising:
removing the cleaning compound from the surface of the substrate by applying a cleaning solution that hydrolyzes the viscous liquid, wherein the cleaning solution includes a chemical that enhances a solubility of the viscous liquid.

6. The method of claim 5, further comprising:
applying deionized water to remove the cleaning solution from the surface of the substrate.

7. The method of claim 1, wherein the at least one of the solid components and the particulate contaminant are removed from the surface of the substrate by a shear component of the mechanical force applied to the cleaning compound.

8. A method for removing particulate contaminants from a semiconductor substrate, comprising:
dispensing a cleaning compound having a viscous liquid with solid components dispersed therein on a substrate surface upon which particulate contaminants are present, wherein the solid components are carboxylic acids having a carbon number greater than or equal to four;

applying a mechanical force having a shear component to the cleaning compound to bring at least one of the solid components within proximity of a particulate contaminant present on the substrate surface, wherein applying the mechanical force to the cleaning compound is performed separately from dispensing the cleaning compound on the surface of the substrate, wherein a ratio of a surface area of the at least one of the solid components to a surface area of the particulate contaminant is greater than or equal to about 2500, and wherein a shear force applied on the particulate contaminant resulting from the shear component of the mechanical force applied to the cleaning compound is magnified by the ratio of the surface area, wherein the shear force applied on the particulate contaminant is greater than an adhesive force between the particulate contaminant and the substrate surface, thereby causing the particulate contaminant to be dislodged from the substrate surface; and removing the at least one of the solid components and the particulate contaminant away from the substrate surface, wherein the method is performed without causing damage to the physical features present on the substrate surface.

9. The method of claim 8, wherein the mechanical force applied to the cleaning compound has a downward component, and wherein the at least one of the solid components is brought into proximity of the particulate contaminant by the downward component of the mechanical force applied to the cleaning compound.

10. The method of claim 8, wherein a viscosity of the viscous liquid is between about 1 cP to about 10,000 cP.

11. The method of claim 8, wherein the viscous liquid is a non-Newtonian liquid whose viscosity decreases with shear stress.

12. The method of claim 8, wherein the viscous liquid is a gel.

13. The method of claim 8, further comprising
removing the cleaning compound from the substrate surface after removing the at least one of the solid components and the particulate contaminant away from the substrate surface by applying a cleaning solution that hydrolyzes the viscous liquid, wherein the cleaning solution includes a chemical that enhances a solubility of the viscous liquid.

14. The method of claim 13, further comprising:
removing the cleaning solution from the substrate surface by applying de-ionized water to the substrate surface.

15. The method of claim 1, wherein the cleaning compound is dispensed on the surface of the substrate from an applicator; and
wherein applying the mechanical force to the cleaning compound includes rotating the substrate beneath the applicator from which the cleaning compound is dispensed such that a rigid surface of the applicator applies a downward mechanical force to the cleaning compound having been previously dispensed on the surface of the substrate from the applicator.

16. The method of claim 1, wherein the carboxylic acids of the solid components are defined by organic acids that include one or more carboxyl groups (COOH).

17. The method of claim 1, wherein the carboxylic acids represent 3% to 5% by weight of the cleaning compound.

18. The method of claim 1, wherein the cleaning compound includes 0.05% to 5% by weight ammonium hydroxide to facilitate dispersion of the solid components within the viscous liquid.

19. The method of claim 1, wherein the cleaning compound includes 0.1% to 5% by weight ammonium dodecyl sulfate as a surfactant.

20. The method of claim 8, wherein the cleaning compound is dispensed on the surface of the substrate from an applicator; and
wherein applying the mechanical force to the cleaning compound includes rotating the substrate beneath the applicator from which the cleaning compound is dispensed such that a rigid surface of the applicator applies a downward mechanical force to the cleaning compound having been previously dispensed on the surface of the substrate from the applicator.

21. The method of claim 8, wherein the carboxylic acids of the solid components are defined by organic acids that include one or more carboxyl groups (COOH).

22. The method of claim 8, wherein the carboxylic acids represent 3% to 5% by weight of the cleaning compound.

23. The method of claim 8, wherein the cleaning compound includes 0.05% to 5% by weight ammonium hydroxide to facilitate dispersion of the solid components within the viscous liquid.

24. The method of claim 8, wherein the cleaning compound includes 0.1% to 5% by weight ammonium dodecyl sulfate as a surfactant.

* * * * *